US008349684B2

(12) United States Patent
Cai et al.

(10) Patent No.: US 8,349,684 B2
(45) Date of Patent: Jan. 8, 2013

(54) SEMICONDUCTOR DEVICE WITH HIGH K DIELECTRIC CONTROL TERMINAL SPACER STRUCTURE

(75) Inventors: Jin Cai, Cortlandt Manor, NY (US); Amlan Majumdar, White Plains, NY (US); Ramachandran Muralidhar, Mahopac, NY (US); Ghavam G. Shahidi, Pound Ridge, NY (US)

(73) Assignees: Freescale Semiconductor, Inc., Austin, TX (US); International Business Machines Corporation, Armonk, NY (US)

( * ) Notice: Subject to any disclaimer, the term of this patent is extended or adjusted under 35 U.S.C. 154(b) by 336 days.

(21) Appl. No.: 12/622,115

(22) Filed: Nov. 19, 2009

(65) Prior Publication Data

US 2011/0117712 A1 May 19, 2011

(51) Int. Cl.
*H01L 21/336* (2006.01)

(52) U.S. Cl. ....................................... 438/257; 438/303

(58) Field of Classification Search .................. 438/257, 438/303
See application file for complete search history.

(56) References Cited

U.S. PATENT DOCUMENTS

| 2005/0266639 A1* | 12/2005 | Frohberg et al. | 438/257 |
| 2009/0278209 A1* | 11/2009 | Noda | 257/408 |
| 2009/0298249 A1* | 12/2009 | Hoentschel et al. | 438/302 |

* cited by examiner

*Primary Examiner* — Jae Lee
(74) *Attorney, Agent, or Firm* — David G. Dolezal

(57) ABSTRACT

A semiconductor device including a control terminal sidewall spacer structure made of a high-K dielectric material. The semiconductor device includes a control terminal where the spacer structure is a sidewall spacer structure for the control terminal. The semiconductor device includes current terminal regions located in a substrate. In some examples, the spacer structure has a height that is less than the height of the control terminal. In some examples, the spacer structure includes portions located over the regions of the substrate between the first current terminal region and the second current terminal region.

9 Claims, 4 Drawing Sheets

SEMICONDUCTOR DEVICE WITH HIGH K DIELECTRIC CONTROL TERMINAL SPACER STRUCTURE

BACKGROUND OF THE INVENTION

1. Field of the Invention

This invention relates in general to semiconductor devices and in particular to semiconductor devices with high-K dielectric spacer structures.

2. Description of the Related Art

Some types of semiconductor devices such as transistors employ control terminal sidewall spacers for separating the control terminal from other conductive or semiconductive structures. For example, a FET transistor includes a gate sidewall spacer typically made of a dielectric. The spacer maybe used as a mask for implanting current terminal conductivity dopants.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

Figure 1:
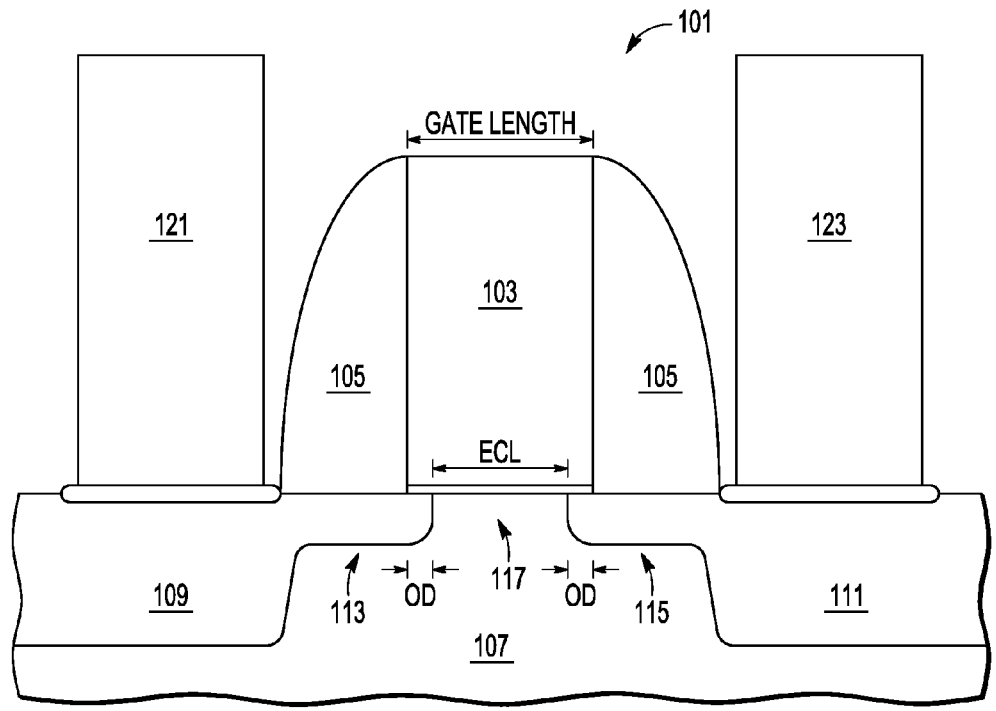
FIG. 1 is a partial cross-sectional side view of a prior art transistor.

FIG. 1 is a partial cross-sectional side view of a prior art transistor. Transistor 101 is a planar FET having a gate 103 located over a substrate 107. Substrate 107 includes a source region 109 and a drain region 111. Source region 109 includes an extension region 113 and drain region 111 includes an extension region 115. A source region and a drain region are both current terminal regions of a FET, and a gate is a control terminal for a FET. A gate sidewall spacer 105 of a nitride surrounds gate 103. A channel region 117 is located underneath gate 103 in substrate 107. Contact 121 is electrically coupled to source region 109 and contact 123 is electrically coupled to drain region 111.

Transistor 101 is an overlapped transistor in that extension regions 113 and 115 extend underneath gate 103. An overlapped transistor is a transistor in which its source region and drain region extend underneath the gate. In FIG. 1, extension regions 113 and 115 extend underneath the gate by the dimension OD in FIG. 1.

With the trend towards smaller transistor sizes, source to drain leakage is becoming more of a problem in integrated circuits due to the smaller effective channel lengths. The effective length of channel region 117 in FIG. 1 is the distance between the source extension region 113 and the drain extension region 115 in the substrate 107 (as indicated by "ECL"). For an overlapped transistor, the effective channel length is less than the gate length.

Underlapped transistors are transistors where the source and drain regions do not extend under the gate. Accordingly, for an underlapped transistor, the effective channel length is greater than the gate length. Since source to drain leakage current is a function of the ECL and decreases with increasing ECL, there is less source to drain leakage for an underlapped transistor than for an overlapped transistor having the same gate length.

However, because the source and drain regions do not extend under the gate for an underlapped FET, the portions of the channel region that are not located under the gate do not undergo full inversion when the transistor is in a conductive state and carriers (either electrons or holes) are flowing from the source region to the drain region. Accordingly, for underlapped transistors, the source resistance and the drain resistance are higher than for overlapped transistors due to the portions of the channel region adjacent to the source and drain regions that are not under the gate, not undergoing full inversion.

As set forth below, providing a control terminal spacer with a high-K dielectric material over the portion of the channel region that is not covered by a control terminal increases the capacitive effect and therefore the electric field strength in that region when the transistor is in a conductive state. An increase in the electric field strength increases the inversion in that portion of the channel region when the transistor is conductive, thereby decreasing the current terminal resistance of such a device. Thus, for an underlapped semiconductor device with a higher-K spacer, the outer fringing field is higher than with a device having a control terminal spacer material of a lower-K dielectric constant.

FIGS. 2-8 are partial cross-sectional side views of a semiconductor device 201 having a control terminal spacer with a high-K dielectric material at various stages in its manufacture according to one embodiment of the present invention.

Figure 2:
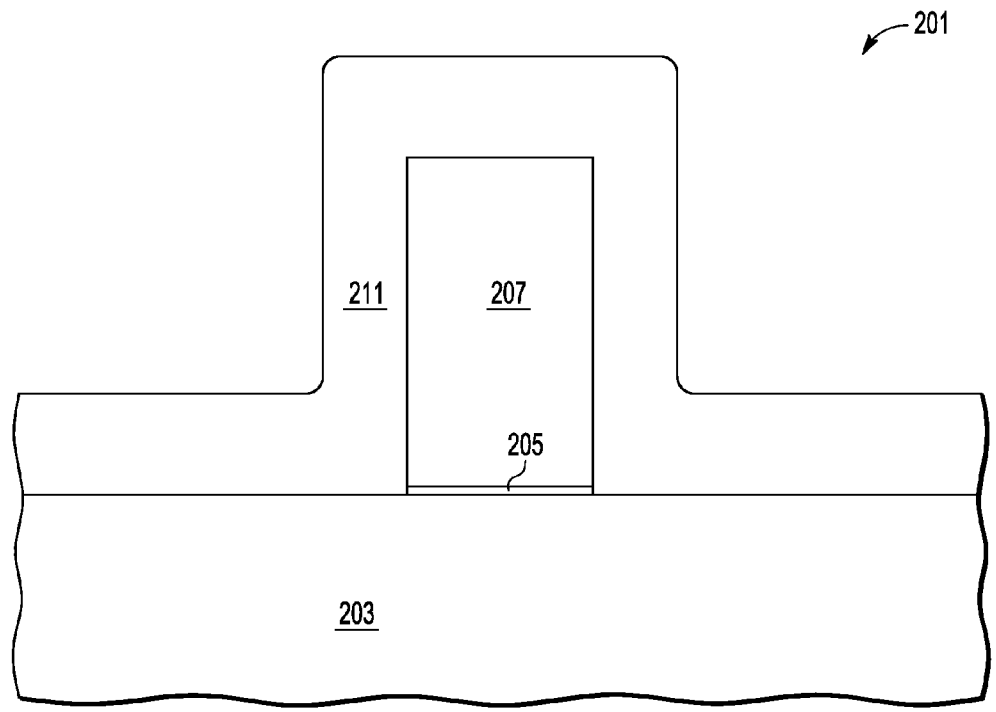
FIGS. 2-8 are partial cross-sectional side views of a semiconductor device at various stages in its manufacture according to one embodiment of the present invention.

FIG. 2 shows a portion of a wafer with a gate 207 located over substrate 203 of the wafer. A gate dielectric layer 205 is located between gate 207 and substrate 203. Substrate 203 includes a semiconductor material which in one embodiment is monocrystalline silicon, but may include other semiconductor materials in other embodiments such as e.g. silicon germanium, silicon carbon, or a group III-V semiconductor material. In the embodiment shown, substrate 203 has a bulk configuration, but may have other configurations in other embodiments such as a semiconductor on insulator configuration. Also, substrate 203 may include multiple layers of different semiconductor materials (e.g. a silicon germanium layer with a silicon layer located there over). It may also include dielectric layers and conductive layers as well e.g. such as under the area where the channel regions and current terminal regions are to be formed. In one embodiment, substrate 203 has been doped with a channel conductivity dopant (e.g. arsenic, boron, or phosphorous).

Gate dielectric layer 205 and gate 207 are formed by patterning a layer of gate dielectric material and gate material located on substrate 203. In one embodiment, gate dielectric material is either grown (e.g. by thermal oxidation) on substrate 203 or deposited on substrate 203. In some embodiments, gate dielectric layer 205 has a thickness in the range of 10-50 Angstroms, but may have other thicknesses in other embodiments. In one embodiment, gate dielectric layer 205 is made of silicon dioxide. In other embodiments, layer 205 is made of a metal oxide layer including a high-K dielectric material such as e.g. hafnium oxide, aluminum oxide, or zirconium oxide to name a few.

In one embodiment, gate 207 is made of a gate material such as e.g. doped polysilicon. However it may be made of other materials in other embodiments including of metal e.g. titanium nitride or tantalum nitride to name a few. Also in some embodiments, gate 207 may include multiple layers of different materials. In one embodiment, gate 207 has a thickness in the range of 300 to 1000 Angstroms, but may have other thicknesses in other embodiments.

After patterning the layer of gate material to form gate 207, a layer of high-K dielectric material is deposited over substrate 203 and over gate 207. In some embodiments, a thin layer (not shown) of silicon dioxide, may be deposited over substrate 203 prior to the formation of layer 211. In one embodiment, layer 211 is made of hafnium oxide, but may be made of other high-K materials such as hafnium silicate, hafnium oxide, aluminum oxide, or zirconium oxide. A high-K dielectric material in the context of a high-K sidewall spacer is a dielectric material having a dielectric constant of greater than 8.0 because the dielectric constant of a conventional silicon nitride spacer is 8.0. In some embodiments, layer 211 has a thickness in the range of 50 to 200 Angstroms, but may have other thickness in other embodiments. In one embodiment, layer 211 is deposited by a chemical vapor deposition process, but may be formed by other processes in other embodiments.

Figure 3:
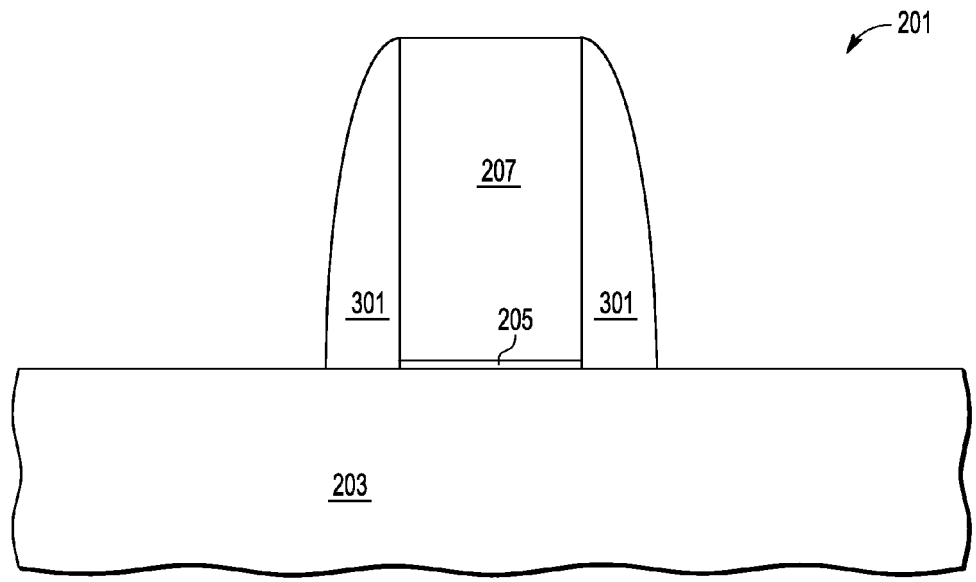

FIG. 3 shows device 201 after layer 211 has been etched to form spacer structure 301. In one embodiment, layer 211 is etched with a reactive ion etch processes using an etchant that is selective with respect to the material of layer 211. In one example, selective reactive ion etching of hafnium oxide can be performed using carbon tetrafluoride ($CF_4$) and chlorine ($Cl_2$)/hydrogen bromide (HBr) chemistries.

Figure 4:
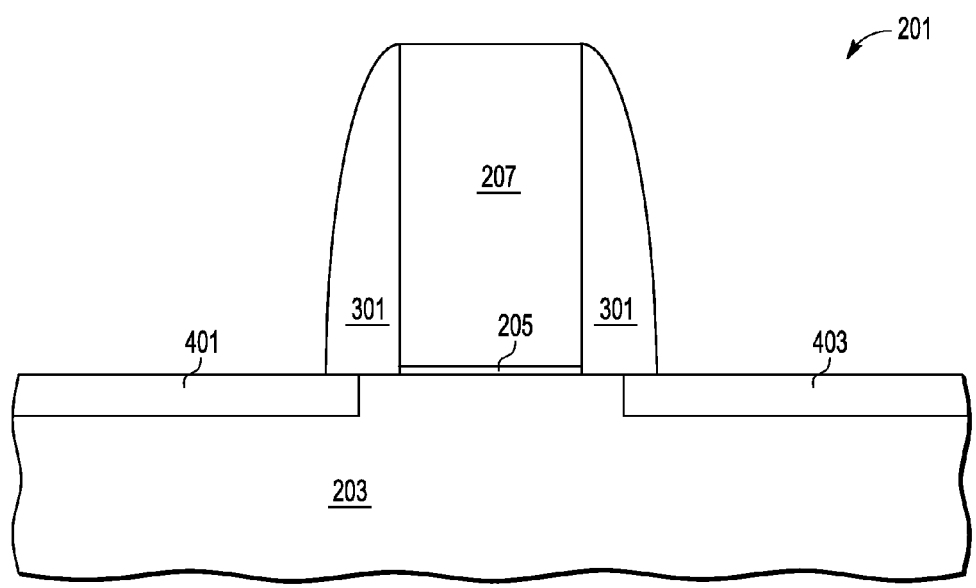

FIG. 4 shows device 201 after source/drain conductivity dopants are implanted for the source and drain extension regions. In one embodiment, the dopants are ion implanted at an angle (e.g. 7-30 degrees) with respect to a normal line to the planar surface of substrate 203 into regions 401 and 403 of substrate 203. Accordingly, some of the dopants are implanted under spacer structure 301. In some embodiments, P-type conductivity dopants such as boron or indium are implanted into regions 401 and 403 for P-channel FETs and N-type conductivity dopants such as arsenic or phosphorous are implanted for N-channel FETs. In other embodiments, the conductivity dopants are implanted in a direction that is normal to the planar surface of the substrate.

Figure 5:
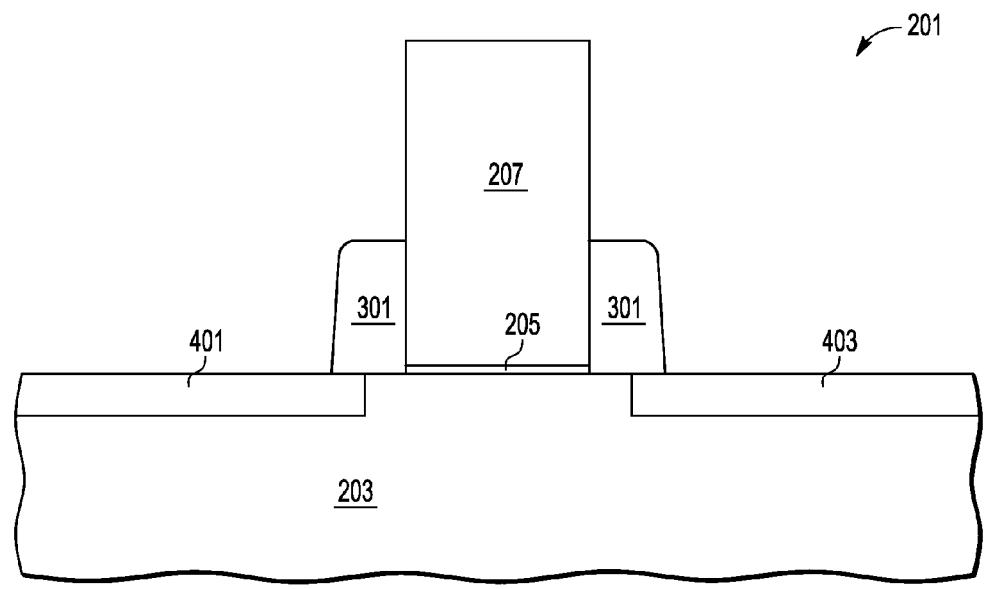

FIG. 5 shows a view of device 201 after the height of spacer structure 301 is further reduced. In one embodiment, the height of the top of structure 301 is reduced below the midplane (e.g. mid plane 831 of in FIG. 8) of gate 207. In one embodiment, structure 301 etched to about ⅓ of the height of gate 207 but may be etched to a lower or higher level in other embodiments. In one embodiment, structure 301 is etched with a reactive ion timed etch using an etchant that is selective with respect to the material of structure 301.

In some embodiment, the extension dopants are implanted into regions 401 and 403 of substrate 203 after structure 301 is etched to its size shown in FIG. 5. In some embodiments, layer 211 may be etched until structure 301 is at a height as shown in FIG. 6.

Figure 6:
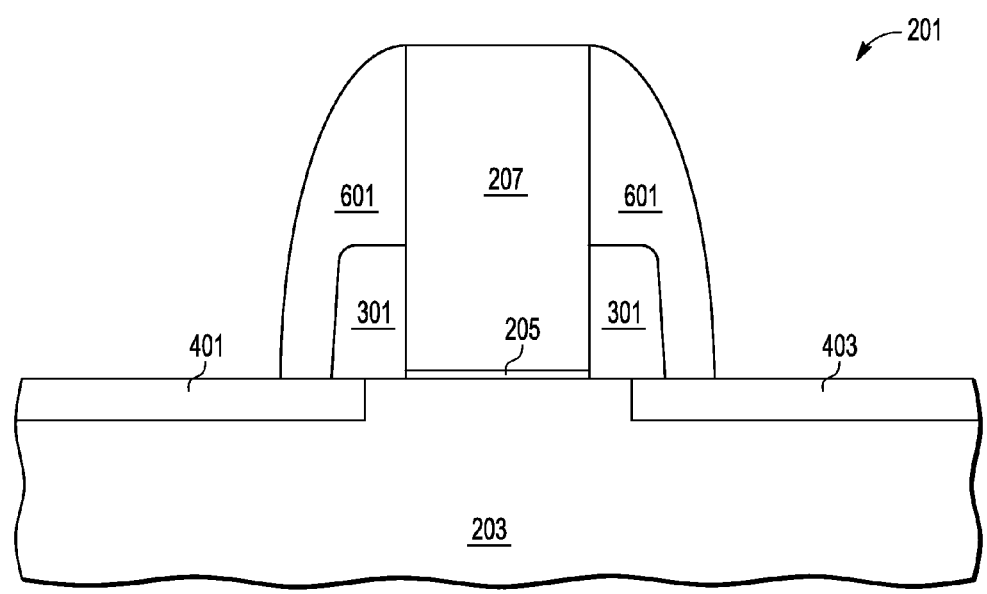

FIG. 6 shows device 201 after spacer structure 601 is formed. Spacer structure 601 is of a lower-K dielectric material than that of structure 301. In one example, structure 601 is made of a nitride which has a dielectric constant of 8.0, although structure 601 can be made of other lower-K dielectric materials in other embodiments such as silicon dioxide.

Structure 601 is formed by depositing a layer of lower-K dielectric material over substrate 203 and anisotropically etching the layer to point where the top of gate 207 is exposed.

Figure 7:
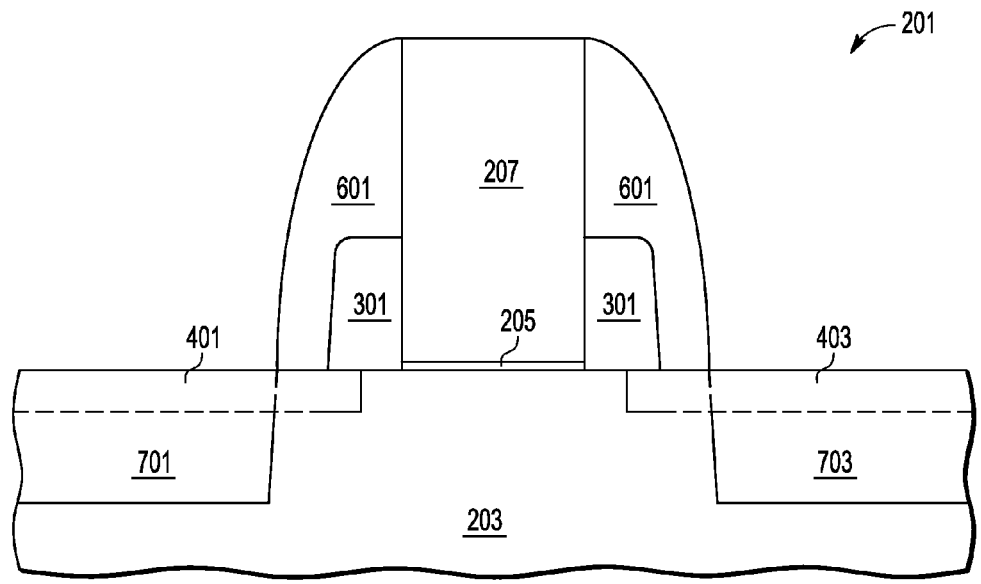

FIG. 7 shows device 201 after source/drain conductivity dopants are ion implanted into regions 701 and 703 of substrate 203. The dopants implanted into regions 701 and 703 are the same conductivity type as implanted into regions 401 and 403 but are implanted deeper into substrate 203 and at heavier doses. In one example where device 201 is an N-channel transistor, arsenic is implanted into regions 401 and 403 at an energy and range of 1-5 KeV and 30-70 Angstroms and is implanted into regions 701 and 703 at an energy and range of 10-30 KeV and 100-300 Angstroms. The ions may be implanted at an angle or in a direction that is normal to the surface of the substrate.

Figure 8:
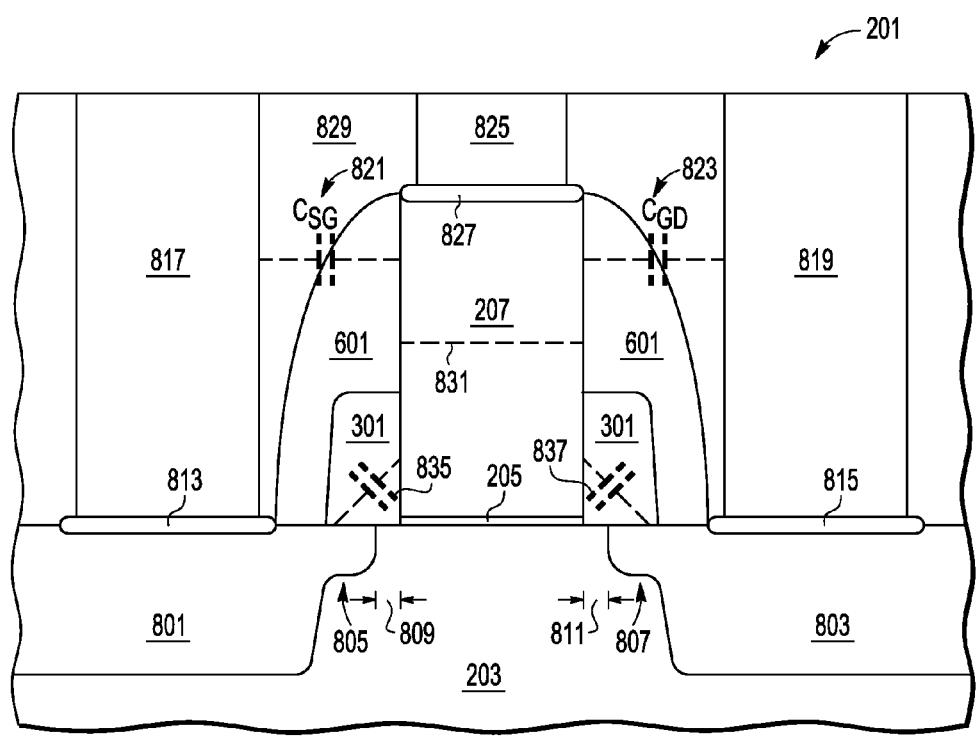

FIG. 8 shows device 201 after further processing is performed to form contacts 817, 819, and 825. Prior to the stage shown in FIG. 8, device 201 was subject to an anneal processes to activate and diffuse the source/drain conductivity dopants implanted into regions 401, 403, 701, and 703 to form source region 801 and drain region 803. Source region 801 includes lightly doped extension region 805 and drain region 803 includes lightly doped extension region 807.

Silicide 813, 827, and 815 are formed in one embodiment, by depositing a metal (e.g. nickel) over substrate 203 and heating the wafer to react the metal with exposed silicon of substrate 203 and gate 207 to form the silicide. However, the silicide may be formed by other processes in other embodiments. Afterwards, contacts 817, 825, and 819 are formed to contact the silicide. In one embodiment, a layer 829 of dielectric material (e.g. TEOS), is formed over the wafer, wherein vias are etched in layer 829 to expose silicide 813, 827, and 815. Afterwards, conductive contact material (e.g. tungsten, titanium, titanium nitride) is deposited over the wafer and then planarized to form contacts 817, 825, and 819. In some embodiments, the contacts may include a barrier layer (not shown). However, the contacts may be formed by other ways and with other materials in other embodiments.

Device 201 is an underlapped device in that no part of source region 801 or drain region 803 is located under gate 207. Accordingly, device 201 should have less source-drain leakage than an overlapped transistor of similar dimensions.

In order to compensate for the increased source and drain resistance of device 201 being an underlapped transistor, device 201 includes high-K dielectric spacer structure 301 that is located over a portions 809 and 811 of substrate 203 that are not below gate 207 but are between source region 801 and drain region 803. Using a high-K dielectric spacer structure 301 provides for an increased gate to source region 801 capacitance 835 and a greater gate to drain region 803 capacitance 837 which increases the electric fields in those regions and therefore increases the carrier inversion in those regions (809 and 811) when device 201 is conductive as well. Because of the increased inversion in those regions, those regions have less resistance when device 201 is conductive.

In the embodiment show, the height of structure 301 was reduced below the top of gate 207. The mid-plane 831 of gate 207 is shown in FIG. 8 with the top of structure 301 located below that. In one embodiment, the height of structure 301 is about a third of the height of gate 207. In one embodiment, structure 301 has a height in the range of 50 to 200 Angstroms, but may have other heights in other embodiments. Reducing the top height of structure 301 reduces the source contact 817 to gate 207 capacitance 821 and the drain contact 819 to gate 207 capacitance 823 in that the majority of dielectric material between those structures is not a high-K material. Accordingly, it is desirable in some embodiments, to reduce the height of structure 301 as much as possible while still maintaining a sufficient thickness of structure 301 to provide for increased current terminal region to control terminal capacitance (e.g. capacitances 835 and 837) while accounting for manufacturing variation. In FIG. 8, capacitances 821, 823, 835 and 837 are shown in dashed lines and are representative of a capacitance that exists during operation of device 201. They are not actual structures in FIG. 8.

In other embodiments, the resultant spacer of structures 601 and 301 may be made of the same high-K dielectric material.

After the stage shown in FIG. 8, further processes maybe performed on the wafer including forming interconnect layers with conductive structures to contact contacts 817, 825, and 819. Afterwards, the wafer is singulated in to a number integrated circuits, each including a number of transistors similar to device 201.

In the embodiment shown, device 201 is a FET transistor that can either be a P-channel or an N-channel device. However, a control terminal spacer structure of a high-K material may be used in other types of semiconductor devices including other types of transistors in other embodiments. Also in other embodiments, a control terminal spacer structure of a high-K material may be used in other types of semiconductor devices including overlapped transistors.

As used here herein, when a first structure is located "over" a second structure, the first structure has a portion that is at a greater height than a portion of the second structure on a line normal to the planar surface of the substrate. It does not just mean that one structure has a height greater than another structure. For example, referring to FIG. 8, contact 819 has a height greater than structure 301 but it is not located "over" structure 301 in that no portion of contact 819 is located at a height greater than a portion of structure 301 on a line normal to the planar surface of the substrate. Also, a first structure is located "under" a second structure when the second structure has a portion that is at a lesser height than a portion of the second structure on a line normal to the planar surface of the substrate. It does not just mean that one structure has a height less than another structure. For example, referring to FIG. 8, source region 801 is not located under contact 819 but is located under contact 817. Furthermore, a first structure is located laterally between two other structures when a portion of the first structure is located between a portion of the other structures on a line that is parallel with a planar surface of the substrate.

In one embodiment, a method of forming a semiconductor device includes forming a control terminal structure of a control terminal over semiconductor material of a substrate and forming a control terminal sidewall spacer adjacent to the control terminal structure and over the semiconductor material of the substrate. The control terminal sidewall spacer includes a high-K dielectric structure located at least at a lower portion of the sidewall spacer. The high-K dielectric structure is formed from a layer of high-K dielectric material formed over the substrate and over the control terminal structure. The method includes forming a first current terminal region and a second current terminal region. At least a portion of the first current terminal region and at least a portion of the second current terminal region are located in the semiconductor material of the substrate. The control terminal structure is not located over the first current terminal region or the second current terminal region. The substrate includes a first region of semiconductor material located between the first current terminal region and the second current terminal region. The first region includes a first portion located under the control terminal structure, a second portion located laterally between the first portion and the first current terminal region, and a third portion located laterally between the first portion and the second current terminal region. The control terminal structure is not located over the second portion of the first region or the third portion of the first region. A first portion of the high-K dielectric structure is located over the second portion of the first region and the second portion of the high-K dielectric structure is located over the third portion of the first region.

Another embodiment includes a method of forming a semiconductor device with a control terminal, a first current terminal region, and a second current terminal region. The method includes forming a control terminal structure of the control terminal over a substrate. The substrate includes semiconductor material. The method includes forming a layer of high-K dielectric material over the substrate and over the control terminal structure and forming a control terminal sidewall spacer structure of high-K dielectric material for the control terminal structure from the layer of high-K dielectric material. The forming includes etching the layer of high-K dielectric material. The control terminal sidewall spacer structure has a top side that is located closer to the substrate than a mid-plane of the control terminal structure. The method includes forming the first current terminal region and the second current terminal region. The first current terminal region and the second current terminal region each include a portion located in the substrate.

Another embodiment includes a method of forming a transistor including a gate, a source region, and a drain region. The method includes forming a gate structure of the gate over a substrate. The substrate includes semiconductor material. The method includes forming a layer of high-K dielectric material over the substrate and over the gate structure and forming a first gate sidewall spacer structure of high-K dielectric material for the gate structure from the layer of high-K dielectric material. The forming includes etching the layer of high-K dielectric material. The first gate sidewall spacer structure has a top side that is located closer to the substrate than a mid-plane of the gate structure. The method includes forming a second gate sidewall spacer structure for the gate structure after the etching the layer. The forming the second gate sidewall spacer structure includes forming a layer of lower-K dielectric material over the substrate including over the gate structure and over the first gate sidewall spacer structure and etching the layer of lower-K dielectric material. The second gate sidewall spacer structure has a top surface that is farther from the substrate than the mid-plane. The method includes forming the source region and the drain region. The source region and the drain region each include a portion located in the substrate. The gate structure is not located over the source region or the drain region. The substrate includes a first region of semiconductor material located between the source region and the drain region The first region includes a first portion located under the gate structure, a second portion located laterally between the first portion and the source region, and a third portion located laterally between the first portion and the drain region. The gate structure is not located over the second portion of the first region or the third portion of the first region. A first portion of the first gate sidewall spacer structure is located over the second portion of the first region and a second portion of the first gate sidewall spacer structure is located over the third portion of the first region.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of forming a semiconductor device with a control terminal, a first current terminal region, and a second current terminal region, the method comprising:
    forming a control terminal structure of the control terminal over a substrate, the substrate including semiconductor material;
    forming a layer of high-K dielectric material over the substrate and over the control terminal structure;
    forming a control terminal sidewall spacer structure of high-K dielectric material for the control terminal structure from the layer of high-K dielectric material, wherein the forming includes etching the layer of high-K dielectric material, wherein the control terminal sidewall spacer structure has a top side that is located closer to the substrate than a mid-plane of the control terminal structure;
    forming the first current terminal region and the second current terminal region, wherein the first current terminal region and the second current terminal region each include a portion located in the substrate;
    forming a second control terminal sidewall spacer structure for the control terminal after the etching the layer, wherein the forming the second control terminal sidewall spacer structure includes forming a layer of lower-K dielectric material over the substrate including over the control terminal structure and over the control terminal sidewall spacer structure and etching the layer of lower K dielectric material, wherein the second control terminal sidewall spacer structure has a top surface that is farther from the substrate than the mid-plane;
    wherein the forming the first current terminal region and the second current terminal region includes:
        implanting a first dosage of conductivity dopants in the substrate before the forming the second control terminal sidewall spacer structure;
        implanting a second dosage of conductivity dopants in the substrate, wherein the implanting the second dosage occurs after the forming the second control terminal sidewall spacer structure, wherein the second dosage is greater than the first dosage.

2. The method of claim 1 wherein a first region of the substrate includes semiconductor material and is located between the first current terminal region and the second current terminal region, a first portion of the first region is located under the control terminal structure, a second portion of the first region is laterally between the first current terminal region and the first portion of the first region and is located under the control terminal sidewall spacer structure, the second portion is not located under the control terminal structure.

3. The method of claim 2 wherein the first region includes a third portion that is located under the control terminal sidewall spacer structure and is located laterally between the first portion and the second current terminal region, the third portion is not located under the control terminal structure.

4. The method of claim 1 wherein the first current terminal region includes a portion located under the control terminal sidewall spacer structure and the second current terminal region includes a portion located under the control terminal sidewall spacer structure.

5. The method of claim 1 wherein the second control terminal sidewall spacer structure includes a nitride.

6. The method of claim 1 wherein the high-K dielectric material has a dielectric constant of 10.0 or greater and the lower K dielectric material has a dielectric constant of 8.0 or less.

7. The method of claim 1, the control terminal sidewall spacer structure of the high-K dielectric material has a top surface that is located 200 Angstroms or less from the substrate.

8. The method of claim 1 wherein the high-K dielectric material includes hafnium oxide.

9. The method of claim 1 wherein the semiconductor device is characterized as a transistor with an effective channel length greater than a gate length of the transistor.

* * * * *